(12) United States Patent
Tahara et al.

(10) Patent No.: US 12,542,520 B2
(45) Date of Patent: Feb. 3, 2026

(54) POWER AMPLIFYING CIRCUIT, RADIO FREQUENCY CIRCUIT, AND COMMUNICATION DEVICE

(71) Applicant: Murata Manufacturing Co., Ltd., Kyoto (JP)

(72) Inventors: Kenji Tahara, Kyoto (JP); Yoshiaki Sukemori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 435 days.

(21) Appl. No.: 18/173,224

(22) Filed: Feb. 23, 2023

(65) Prior Publication Data
US 2023/0198481 A1  Jun. 22, 2023

Related U.S. Application Data

(63) Continuation of application No. PCT/JP2021/033405, filed on Sep. 10, 2021.

(30) Foreign Application Priority Data

Nov. 25, 2020  (JP) ................. 2020-195397

(51) Int. Cl.
*H03F 1/02* (2006.01)
*H03F 1/56* (2006.01)
(Continued)

(52) U.S. Cl.
CPC ........... *H03F 3/211* (2013.01); *H03F 1/0277* (2013.01); *H03F 1/565* (2013.01); *H03F 3/245* (2013.01); *H03F 2200/387* (2013.01)

(58) Field of Classification Search
CPC ................. H03F 1/02; H03F 1/07; H03F 9/00
(Continued)

(56) References Cited

U.S. PATENT DOCUMENTS 6,795,495 B2 * 9/2004 Koren ................. H04L 27/0002
327/105
7,560,983 B1 * 7/2009 Luschas ................ H03F 1/0277
330/124 R
(Continued)

FOREIGN PATENT DOCUMENTS

JP  2006-525749 A  11/2006
JP  2012-199746 A  10/2012
(Continued)

OTHER PUBLICATIONS

International Search Report for PCT/JP2021/033405 dated Dec. 7, 2021.

*Primary Examiner* — Henry Choe
(74) *Attorney, Agent, or Firm* — McDonald Hopkins LLC

(57) ABSTRACT

Size reduction is enabled. A power amplifying circuit includes a splitter, a first amplifier, a second amplifier, and a third amplifier. The splitter splits an input signal into a first signal and a second signal. The first amplifier has a first input terminal and a first output terminal, amplifies the first signal, and outputs a first amplified signal. The second amplifier has a second input terminal and a second output terminal, amplifies the second signal, and outputs a second amplified signal. The third amplifier has a third input terminal and a third output terminal, amplifies the first signal, and outputs a third amplified signal. The first output terminal and the second output terminal are connected to each other, the third input terminal is connected to the first input terminal, and the third output terminal is connected to the second output terminal.

17 Claims, 4 Drawing Sheets

(51) Int. Cl.
*H03F 3/21* (2006.01)
*H03F 3/24* (2006.01)

(58) Field of Classification Search
USPC ..................................... 330/124 R, 295, 165
See application file for complete search history.

(56) References Cited

U.S. PATENT DOCUMENTS

| | | | | |
|---|---|---|---|---|
| 8,598,951 | B1* | 12/2013 | Hau | .......................... H03F 3/72 |
| | | | | 330/51 |
| 8,610,503 | B2* | 12/2013 | Kaczman | .................. H03F 3/72 |
| | | | | 330/124 R |
| 2003/0201833 | A1 | 10/2003 | Pengelly et al. | |
| 2009/0021301 | A1* | 1/2009 | Hellberg | ............... H03F 1/0294 |
| | | | | 330/149 |
| 2015/0333706 | A1* | 11/2015 | Blednov | .............. H04B 1/0483 |
| | | | | 455/114.3 |
| 2016/0006415 | A1 | 1/2016 | Takematsu | |
| 2016/0226450 | A1 | 8/2016 | Ma et al. | |
| 2019/0158047 | A1 | 5/2019 | Watkins | |

FOREIGN PATENT DOCUMENTS

| | | |
|---|---|---|
| JP | S184614 B2 | 8/2017 |
| JP | S612910 B2 | 11/2019 |
| WO | 2008/012883 A1 | 1/2008 |
| WO | 2014/171033 A1 | 10/2014 |

\* cited by examiner

POWER AMPLIFYING CIRCUIT, RADIO FREQUENCY CIRCUIT, AND COMMUNICATION DEVICE

CROSS REFERENCE TO RELATED APPLICATION

This is a continuation of International Application No. PCT/JP2021/033405 filed on Sep. 10, 2021 which claims priority from Japanese Patent Application No. 2020-195397 filed on Nov. 25, 2020. The contents of these applications are incorporated herein by reference in their entireties.

BACKGROUND ART

Technical Field

The present disclosure generally relates to power amplifying circuits, radio frequency circuits, and communication devices, and more specifically, to a power amplifying circuit including a plurality of amplifiers, a radio frequency circuit including the power amplifying circuit, and a communication device including the radio frequency circuit.

Patent document 1 describes a Doherty amplifier (power amplifying circuit) including a carrier amplifier (first amplifier) and a peak amplifier (second amplifier).

The carrier amplifier and the peak amplifier are connected in parallel to each other. A λ/4 transmission line is inserted in each of the carrier amplifier and the peak amplifier.

Patent Document 1: International Publication No. 2008/012883

BRIEF SUMMARY

The power amplifying circuit described in Patent document 1 needs space for installing the λ/4 transmission lines, and this leads to an issue of increasing the size of the power amplifying circuit.

The present disclosure provides a power amplifying circuit, a radio frequency circuit, and a communication device, in each of which size reduction is enabled.

A power amplifying circuit according to an aspect of the present disclosure includes a splitter, a first amplifier, a second amplifier, and a third amplifier. The splitter splits an input signal into a first signal and a second signal. The first amplifier has a first input terminal and a first output terminal, amplifies the first signal, and outputs a first amplified signal. The second amplifier has a second input terminal and a second output terminal, amplifies the second signal, and outputs a second amplified signal. The third amplifier has a third input terminal and a third output terminal, amplifies the first signal, and outputs a third amplified signal. The first output terminal and the second output terminal are connected to one another. The third input terminal is connected to the first input terminal. The third output terminal is connected to the second output terminal.

A radio frequency circuit according to an aspect of the present disclosure includes the power amplifying circuit and a filter. The filter allows a radio frequency signal to pass through, the radio frequency signal being amplified in power by the power amplifying circuit and output from the power amplifying circuit.

A communication device according to an aspect of the present disclosure includes the radio frequency circuit and a signal processing circuit. The signal processing circuit is connected to the radio frequency circuit.

In each of the power amplifying circuit according to the aspect of the present disclosure, the radio frequency circuit according to the aspect of the present disclosure, and the communication device according to the aspect of the present disclosure, size reduction is enabled.

DETAILED DESCRIPTION

Figure 1:
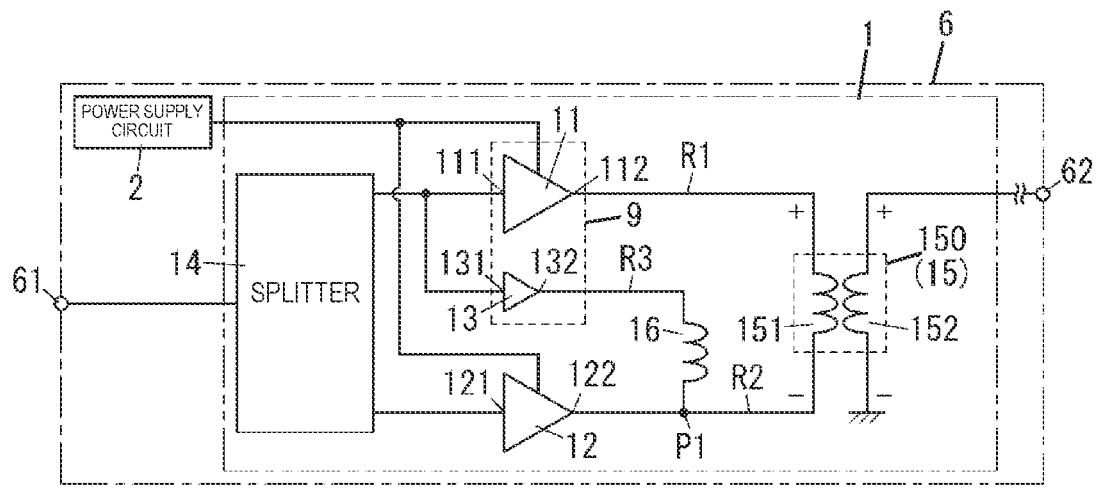
FIG. 1 is a circuit diagram of a power amplifying circuit and a radio frequency circuit according to an embodiment.

Drawings referred to in the following embodiment and the like are all schematic diagrams, and each ratio of sizes or thicknesses of constituent elements in the drawings does not necessarily reflect the actual dimensional ratio. Note that in FIG. 1, illustration of a filter 3 is omitted in a radio frequency circuit 6, and in FIG. 2, illustration of a power supply circuit 2 is omitted in the radio frequency circuit 6.

(Embodiment)

Figure 2:
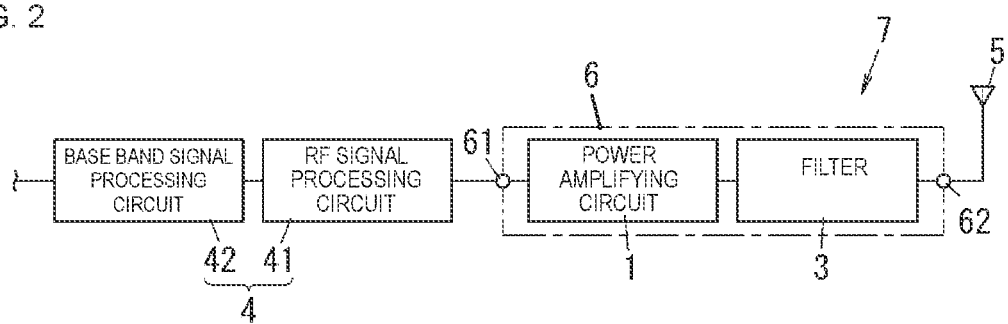
FIG. 2 is a block diagram of a communication device according to an embodiment.

As illustrated in FIG. 1, a power amplifying circuit 1 according to the present embodiment includes, for example, a splitter 14, a first amplifier 11, a second amplifier 12, and a third amplifier 13. The splitter 14 splits an input signal into a first signal and a second signal. The second signal is a signal whose phase is different from that of the first signal. The first amplifier 11 has a first input terminal 111 and a first output terminal 112. The first amplifier 11 amplifies the first signal and outputs a first amplified signal. The second amplifier 12 has a second input terminal 121 and a second output terminal 122. The second amplifier 12 amplifies the second signal and outputs a second amplified signal. The third amplifier 13 has a third input terminal 131 and a third output terminal 132. The third amplifier 13 amplifies the first signal and outputs a third amplified signal. The first output terminal 112 and the second output terminal 122 are connected to each other. The third input terminal 131 is connected to the first input terminal 111. The third output terminal 132 is connected to the second output terminal 122. This enables size reduction of the power amplifying circuit 1.

Further, as illustrated in FIG. 1, the power amplifying circuit 1 according to the present embodiment further includes an inductor 16. The inductor 16 is provided in a third signal path R3 from the third output terminal 132 of the third amplifier 13 to a connection point P1 of the third output terminal 132 and the second output terminal 122 of the second amplifier 12.

Further, as illustrated in FIG. 1, the power amplifying circuit 1 according to the present embodiment further includes a combining circuit 15. The combining circuit 15 includes a transformer 150. The combining circuit 15 combines the first amplified signal, the second amplified signal, and the third amplified signal.

Figure 4:
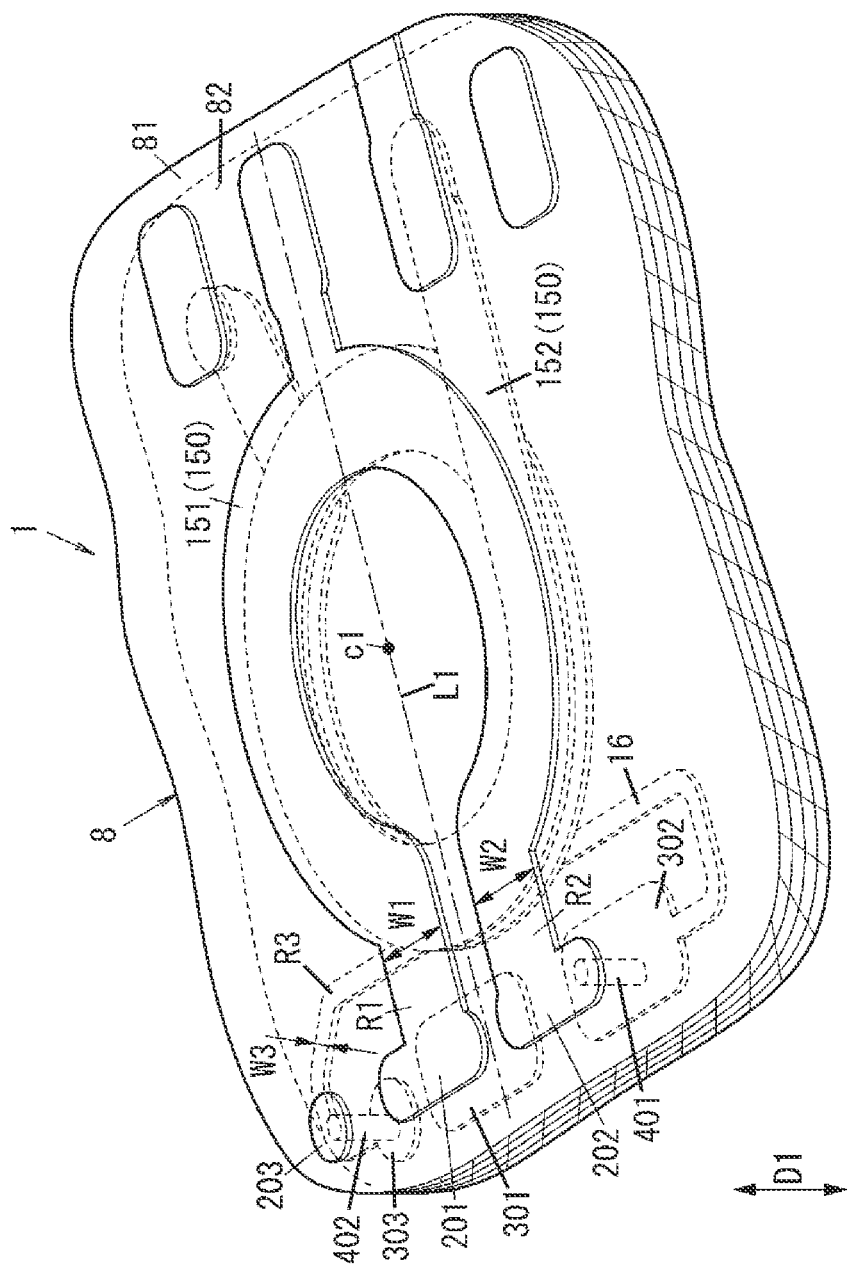
FIG. 4 is a perspective view of relevant part of the power amplifying circuit according to the embodiment seen from a top surface side thereof.

Further, as illustrated in FIG. 4, the power amplifying circuit 1 according to the present embodiment further includes a mounting board 8. The mounting board 8 has a first principal surface 81 and a second principal surface 82, which face each other. The splitter 14, the first amplifier 11, the second amplifier 12, and the third amplifier 13, which are described above, are mounted in or on the mounting board 8. In plan view of the mounting board 8 seen in a thickness direction D1, a first signal path R1 through which the first amplified signal travels and a second signal path R2 through which the second amplified signal travels are symmetric in shape.

(1) POWER AMPLIFYING CIRCUIT, RADIO FREQUENCY CIRCUIT, AND COMMUNICATION DEVICE (1.1) Configuration of Radio Frequency Circuit First, the configuration of the radio frequency circuit 6 according to the present embodiment is described with reference to FIG. 1 and FIG. 2.

As illustrated in FIG. 2, the radio frequency circuit 6 is, for example, for use in a communication device 7. The communication device 7 is, for example, a mobile phone (for example, a smartphone). However, the communication device 7 is not limited thereto and may be, for example, a wearable terminal (for example, a smartwatch) or the like. The radio frequency circuit 6 is, for example, a circuit compatible with the 4G (fourth generation mobile telecommunications) standard or the 5G (fifth generation mobile telecommunications) standard. The 4G standard is, for example, the 3GPP (Third Generation Partnership Project) LTE (Long Term Evolution standard). The 5G standard is, for example, the 5G NR (New Radio). The radio frequency circuit 6 is, for example, a circuit compatible with carrier aggregation and dual connectivity.

The radio frequency circuit 6 is configured, for example, to amplify a radio frequency signal (transmitting signal) input from a signal processing circuit 4 and output an amplified signal to an antenna 5. The signal processing circuit 4 is not a constituent element of the radio frequency circuit 6 but is a constituent element of the communication device 7 that includes the radio frequency circuit 6. The radio frequency circuit 6 is controlled, for example, by the signal processing circuit 4 included in the communication device 7.

As illustrated in FIG. 1 and FIG. 2, the radio frequency circuit 6 includes the power amplifying circuit 1, the power supply circuit 2, the filter 3, a signal input terminal 61, and an antenna terminal 62.

The power amplifying circuit 1, for example, amplifies an input signal from the signal processing circuit 4 and outputs an amplified signal. The input signal is a radio frequency signal (transmitting signal) of a predetermined frequency band. The predetermined frequency band includes, for example, a plurality of communication bands that are different from each other.

As illustrated in FIG. 1, the power amplifying circuit 1 includes the first amplifier 11, the second amplifier 12, the third amplifier 13, and the splitter 14. The power amplifying circuit 1 further includes the combining circuit 15 and the inductor 16. The splitter 14 splits an input signal from the signal processing circuit 4 (see FIG. 2) into the first signal and the second signal. The first signal and the second signal are signals whose phases are different from each other. The first amplifier 11 amplifies the first signal with a first amplification factor and outputs the first amplified signal. The second amplifier 12 amplifies the second signal with a second amplification factor and outputs the second amplified signal. The third amplifier 13 amplifies the first signal with a third amplification factor and outputs the third amplified signal. The third amplification factor is different from the first amplification factor. The combining circuit 15 includes the transformer 150 and combines the first amplified signal, the second amplified signal, and the third amplified signal. The inductor 16 is provided in the third signal path R3 from the third output terminal 132 of the third amplifier 13 to the connection point P1 of the third output terminal 132 and the second output terminal 122 of the second amplifier 12.

The power supply circuit 2 includes, for example, a DC/DC converter. The power supply circuit 2 applies (supplies) a power voltage to the first amplifier 11, the second amplifier 12, and the third amplifier 13. That is to say, in the power amplifying circuit 1 according to the present embodiment, the single power supply circuit 2 supplies the power voltage to a plurality of amplifiers, which are the first amplifier 11, the second amplifier 12, and the third amplifier 13.

The filter 3 is a filter whose pass band is a transmission band of a predetermined communication band (for example, Band 3). The filter 3 is, for example, a one-chip acoustic wave filter, and each of a plurality of series arm resonators and parallel arm resonators is made up of an acoustic wave resonator. The acoustic wave filter is, for example, a surface acoustic wave filter that uses a surface acoustic wave. In the surface acoustic wave filter, each of the plurality of series arm resonators and parallel arm resonators is, for example, a SAW (Surface Acoustic Wave) resonator.

As illustrated in FIG. 2, the signal input terminal 61 is connected to a RF signal processing circuit 41 of the signal processing circuit 4. The signal input terminal 61 is a terminal for inputting a radio frequency signal (transmitting signal) from the RF signal processing circuit 41 to the radio frequency circuit 6.

As illustrated in FIG. 2, the antenna terminal 62 is connected to the antenna 5. In the present embodiment, the antenna terminal 62 is a terminal for outputting a radio frequency signal (transmitting signal) from the radio frequency circuit 6 to the antenna 5.

(1.2) Configuration of Communication Device

Next, the configuration of the communication device 7 according to the present embodiment is described with reference to FIG. 2.

The communication device 7 includes the aforementioned radio frequency circuit 6 and the aforementioned signal processing circuit 4. The communication device 7 further includes the antenna 5. The communication device 7 further includes a circuit board (not illustrated) in or on which the radio frequency circuit 6 is mounted. The circuit board is, for example, a printed wiring board. The circuit board has a ground electrode to which a ground potential is given.

The signal processing circuit 4 includes, for example, the RF signal processing circuit 41 and a base band signal processing circuit 42. The RF signal processing circuit 41 is, for example, a RFIC (Radio Frequency Integrated Circuit) and performs signal processing on a radio frequency signal. For example, the RF signal processing circuit 41 performs signal processing such as up-converting or the like on a radio frequency signal (transmitting signal) output from the base band signal processing circuit 42, and outputs a radio frequency signal on which the signal processing has been performed. The base band signal processing circuit 42 is, for example, a BBIC (Baseband Integrated Circuit). The base band signal processing circuit 42 generates an I-phase signal and a Q-phase signal from a base band signal. The base band signal is, for example, an audio signal, an image signal, or the like input from outside. The base band signal processing circuit 42 performs IQ modulation processing by combining the I-phase signal and the Q-phase signal and outputs a transmitting signal. At this time, the transmitting signal is generated as a modulated signal (IQ signal) in which a carrier signal of a predetermined frequency has undergone amplitude modification using a period longer than the period of this carrier signal. The radio frequency circuit 6 transmits a radio frequency signal (transmitting signal) between the antenna 5 and the RF signal processing circuit 41 of the signal processing circuit 4.

The antenna 5 is connected to the antenna terminal 62 of the radio frequency circuit 6. The antenna 5 has a transmitting function of emitting a transmitting signal (radio frequency signal) output from the radio frequency circuit 6 in a radio wave form.

(1.3) Configuration of Power Amplifying Circuit

Next, the configuration of the power amplifying circuit 1 according to the present embodiment is described with reference to FIG. 1.

As illustrated in FIG. 1, the power amplifying circuit 1 includes the first amplifier 11, the second amplifier 12, the third amplifier 13, and the splitter 14. The power amplifying circuit 1 further includes the combining circuit 15 and the inductor 16. As illustrated in FIG. 1, in the power amplifying circuit 1 according to the present embodiment, the first amplifier 11 and the third amplifier 13 make up a single amplifier 9. That is to say, the first amplifier 11 and the third amplifier 13 are united.

The first amplifier 11 is, for example, a Class AB amplifier (hereinafter, also referred to as "carrier amplifier 11"). The first amplifier 11 has the first input terminal 111 and the first output terminal 112. The first input terminal 111 is connected to the splitter 14. The first output terminal 112 is connected, via the first signal path R1, to a first end portion of a primary winding 151 of the transformer 150 of the combining circuit 15. The first signal path R1 is a path that connects the first output terminal 112 of the first amplifier 11 and the first end portion of the primary winding 151 of the transformer 150. The first amplifier 11 amplifies the first signal, which is sent from the splitter 14 and input to the first input terminal 111, with the first amplification factor and outputs the first amplified signal, which has been amplified, from the first output terminal 112.

The second amplifier 12 is, for example, a Class C amplifier (hereinafter, also referred to as "peak amplifier 12"). The second amplifier 12 has the second input terminal 121 and the second output terminal 122. The second input terminal 121 is connected to the splitter 14. The second output terminal 122 is connected, via the second signal path R2, to a second end portion of the primary winding 151 of the transformer 150 of the combining circuit 15. The second signal path R2 is a path that connects the second output terminal 122 of the second amplifier 12 and the second end portion of the primary winding 151 of the transformer 150. The second amplifier 12 amplifies the second signal, which is sent from the splitter 14 and input to the second input terminal 121, with the second amplification factor and outputs the second amplified signal, which has been amplified, from the second output terminal 122. The second amplification factor may be the same as or different from the first amplification factor. In the present embodiment, the first amplification factor and the second amplification factor are the same.

Figure 3:
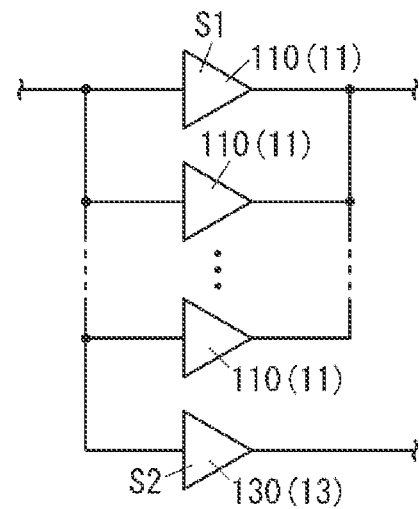
FIG. 3 is a schematic diagram of a first amplifier and a third amplifier of the power amplifying circuit according to the embodiment.

The third amplifier 13 has a second unit cell 130 that is equivalent to a first unit cell 110 that is one of a plurality of the first unit cells 110 (see FIG. 3) that make up the first amplifier 11, which will be described below. That is to say, of (M+N) unit cells, M unit cells are the first unit cells 110, and N unit cells are the second unit cells 130. The example of FIG. 3 illustrates the case where M≥3 and N=1. Accordingly, as in the first amplifier 11, the third amplifier 13 is a Class AB amplifier. The third amplifier 13 has the third input terminal 131 and the third output terminal 132. The third input terminal 131 is connected to the splitter 14. Further, the third input terminal 131 is connected to the first input terminal 111. The third output terminal 132 is connected to the second signal path R2 via the third signal path R3. The third signal path R3 is a path that connects the third output terminal 132 of the third amplifier 13 and the second output terminal 122 of the second amplifier 12. That is to say, the third output terminal 132 is connected to the second output terminal 122 via the third signal path R3. The third amplifier 13 amplifies the first signal, which is sent from the splitter 14 and input to the third input terminal 131, with the third amplification factor and outputs the third amplified signal, which has been amplified, from the third output terminal 132. The third amplification factor may be the same as or different from the first amplification factor. In the present embodiment, the first amplification factor and the third amplification factor are the same.

In the power amplifying circuit 1 according to the present embodiment, as described above, the first output terminal 112 of the first amplifier 11 is connected to the first end portion of the primary winding 151 of the transformer 150 via the first signal path R1. Further, as described above, the second output terminal 122 of the second amplifier 12 is connected to the second end portion of the primary winding 151 of the transformer 150 via the second signal path R2. That is to say, in the power amplifying circuit 1 according to the present embodiment, the first output terminal 112 and the second output terminal 122 are connected to each other via the primary winding 151 of the transformer 150. In short, in the power amplifying circuit 1 according to the present embodiment, the first output terminal 112 and the second output terminal 122 are connected indirectly via the primary winding 151 of the transformer 150.

The splitter 14 has a function of splitting the input signal into the first signal and the second signal. As illustrated in FIG. 2, the input signal is input from the RF signal processing circuit 41 of the signal processing circuit 4 via the signal input terminal 61. The first signal is input to the first amplifier 11 and the third amplifier 13. The second signal is input to the second amplifier 12. The first signal and the second signal are signals whose phases are different from each other. For example, the first signal has an inverted phase relative to the phase of the second signal. Accordingly, the first amplified signal output from the first output terminal 112 of the first amplifier 11 also has an inverted phase relative to the phase of the second amplified signal output from the second output terminal 122 of the second amplifier 12.

As illustrated in FIG. 1, the combining circuit 15 includes the transformer 150. The transformer 150 includes the primary winding 151 and a secondary winding 152. As described above, the first end portion of the primary winding 151 is connected to the first output terminal 112 of the first amplifier 11 via the first signal path R1. As described above, the second end portion of the primary winding 151 is connected to the second output terminal 122 of the second amplifier 12 via the second signal path R2. A first end portion of the secondary winding 152 is connected to a subsequent circuit (for example, the filter 3). A second end portion of the secondary winding 152 is connected to ground. The ratio of numbers of turns of the primary winding 151 and the secondary winding 152 is, for example, 1:m.

The inductor 16 is provided in the third signal path R3 from the third amplifier 13. More specifically, the inductor 16 is provided in between the third output terminal 132 of the third amplifier 13 and the connection point P1 of the second signal path R2 and the third signal path R3. The inductor 16 adjusts the impedance of the third amplifier 13. This enables the adjustment of a phase of the third amplified signal output from the third amplifier 13. The third amplified signal at the third output terminal 132 of the third amplifier 13 has the same phase as the phase of the first signal input to the third input terminal 131. In contrast, the third amplified signal at the connection point P1 of the second signal path R2 and the third signal path R3 has an inverted phase relative to the phase of the first signal because of the inductor 16.

As illustrated in FIG. 4, the power amplifying circuit 1 according to the present embodiment further includes the mounting board 8. The mounting board 8 has the first principal surface 81 and the second principal surface 82, which face each other in the thickness direction D1 of the mounting board 8. For example, the mounting board 8 is a multilayer board including a plurality of dielectric layers and a plurality of conductive layers. The mounting board 8 is, for example, a LTCC (Low Temperature Co-fired Ceramics) board. However, the mounting board 8 is not limited to the LTCC board and may alternatively be, for example, a printed wiring board, a HTCC (High Temperature Co-fired Ceramics) board, a resin multilayer board, or the like.

In the power amplifying circuit 1 according to the present embodiment, a plurality of circuit components are mounted on the first principal surface 81 of the mounting board 8. The plurality of circuit components include the first amplifier 11, the second amplifier 12, the third amplifier 13, and the splitter 14, which are described above. Here, "a circuit component is mounted on the first principal surface 81 of the mounting board 8" means that the circuit component is arranged on (mechanically connected to) the first principal surface 81 of the mounting board 8 and/or the circuit component is electrically connected to (an appropriate conductive part of) the mounting board 8.

Further, as illustrated in FIG. 4, in the power amplifying circuit 1 according to the present embodiment, the primary winding 151 of the transformer 150 of the combining circuit 15 is mounted on the first principal surface 81 of the mounting board 8. Moreover, as illustrated in FIG. 4, the secondary winding 152 of the transformer 150 of the combining circuit 15 is provided in the mounting board 8. Further, as illustrated in FIG. 4, the inductor 16 is provided in the mounting board 8. That is to say, each of the secondary winding 152 of the transformer 150 and the inductor 16 is an inner layer inductor.

(2) DETAILS OF FIRST AMPLIFIER AND THIRD AMPLIFIER

Next, details of the first amplifier 11 and the third amplifier 13 are described with reference to FIG. 3.

As illustrated in FIG. 3, the first amplifier 11 includes a plurality of the first unit cells 110. The number of the first unit cells 110 of the first amplifier 11 is, for example, 100. As illustrated in FIG. 3, the third amplifier 13 includes a single second unit cell 130. That is to say, the number of the first unit cells 110 of the first amplifier 11 is greater than the number of the second unit cells 130 of the third amplifier 13.

As described above, the second unit cell 130 is made up of a unit cell similar to the first unit cell 110. That is to say, in the present embodiment, the first amplifier 11 is made up of 99 first unit cells 110, and the third amplifier 13 is made up of the single second unit cell 130. In the first amplifier 11, 99 first unit cells 110 are connected in parallel to each other. As described above, in the power amplifying circuit 1 according to the present embodiment, the third amplifier 13 is made up of the second unit cell 130, which is similar to one of the first unit cells 110 of the first amplifier 11, and is united with the first amplifier 11. Further, in the power amplifying circuit 1 according to the present embodiment, the first amplifier 11 and the third amplifier 13 make up one chip.

Here, as described above, the single second unit cell 130 of the third amplifier 13 is made up of a unit cell similar to one of the first unit cells 110 of the first amplifier 11. Thus, an area S1 of each of the plurality of the first unit cells 110 of the first amplifier 11 is equal to an area S2 of the second unit cell 130 of the third amplifier 13. Here, "the area S1 is equal to the area S2" means to include not only the case where the area S1 and the area S2 are precisely the same but also the case where the area S2 is within the range of the area S1±5%.

(3) DETAILS OF FIRST SIGNAL PATH, SECOND SIGNAL PATH, AND THIRD SIGNAL PATH

Next, details of the first signal path R1, the second signal path R2, and the third signal path R3 are described with reference to FIG. 4. Note that in FIG. 4, illustration of the first amplifier 11, the second amplifier 12, the third amplifier 13, and the splitter 14 is omitted.

As described above, the transformer 150 of the combining circuit 15 (see FIG. 1) includes the primary winding 151 and the secondary winding 152.

The primary winding 151 is mounted on the first principal surface 81 of the mounting board 8. The primary winding 151 has a C-shaped form in plan view seen in the thickness direction D1 of the mounting board 8. The first signal path R1 is connected to the first end portion of the primary winding 151, and the second signal path R2 is connected to the second end portion of the primary winding 151. A first connection terminal 201 is connected to an end portion of the first signal path R1 opposite to the primary winding 151 side. The first output terminal 112 (see FIG. 1) of the first amplifier 11 is connected to the first connection terminal 201. A second connection terminal 202 is connected to an end portion of the second signal path R2 opposite to the primary winding 151 side. The second output terminal 122 (see FIG. 1) of the second amplifier 12 is connected to the second connection terminal 202.

The secondary winding 152 is provided in the mounting board 8. That is to say, the secondary winding 152 is an inner layer inductor. The secondary winding 152 has a circular ring shape in plan view seen in the thickness direction D1 of the mounting board 8. Further, the secondary winding 152 is wound in two layers in plan view seen in the thickness direction D1 of the mounting board 8. The primary winding 151 and the secondary winding 152 face each other in the thickness direction D1 of the mounting board 8.

The third signal path R3 has a U-shaped form in plan view seen in the thickness direction D1 of the mounting board 8. A second connection electrode 302 is connected to a first end portion of the third signal path R3, and a third connection electrode 303 is connected to a second end portion of the third signal path R3. The second connection electrode 302 faces the second connection terminal 202 in the thickness direction D1 of the mounting board 8 and is connected to the second connection terminal 202 by way of a via 401. The third connection electrode 303 faces the third connection terminal 203 in the thickness direction D1 of the mounting board 8 and is connected to the third connection terminal 203 by way of a via 402. The third output terminal 132 (see FIG. 1) of the third amplifier 13 is connected to the third connection terminal 203. Further, a first connection electrode 301 is arranged in between the second connection electrode 302 and the third connection electrode 303. The first connection electrode 301 faces the first connection terminal 201 in the thickness direction D1 of the mounting board 8.

Here, in the power amplifying circuit 1 according to the present embodiment, the first signal path R1 and the second signal path R2 are symmetric in shape in plan view seen in the thickness direction D1 of the mounting board 8. More specifically, when seen in the thickness direction D1 of the mounting board 8, the first signal path R1 and the second signal path R2 are axisymmetric with respect to a straight line L1 that goes through a center c1 of the primary winding 151 and is orthogonal to a direction in which the first signal path R1 and the second signal path R2 are lined up. Further, in the power amplifying circuit 1 according to the present embodiment, in plan view in the thickness direction D1 of the mounting board 8, a wire width W1 of the first signal path R1 is equal to a wire width W2 of the second signal path R2. Because of this, there is an effect of facilitating the impedance matching between the first amplifier 11 and the second amplifier 12.

Further, in the power amplifying circuit 1 according to the present embodiment, in plan view in the thickness direction D1 of the mounting board 8, the wire width W1 of the first signal path R1 is wider than a wire width W3 of the third signal path R3. Further, in the power amplifying circuit 1 according to the present embodiment, in plan view in the thickness direction D1 of the mounting board 8, the wire width W2 of the second signal path R2 is wider than the wire width W3 of the third signal path R3.

(4) OPERATION OF POWER AMPLIFYING CIRCUIT

Next, the operation of the power amplifying circuit 1 according to the present embodiment is described with reference to FIG. 5A and FIG. 5B.

(4.1) First Operation

Figure 5A:
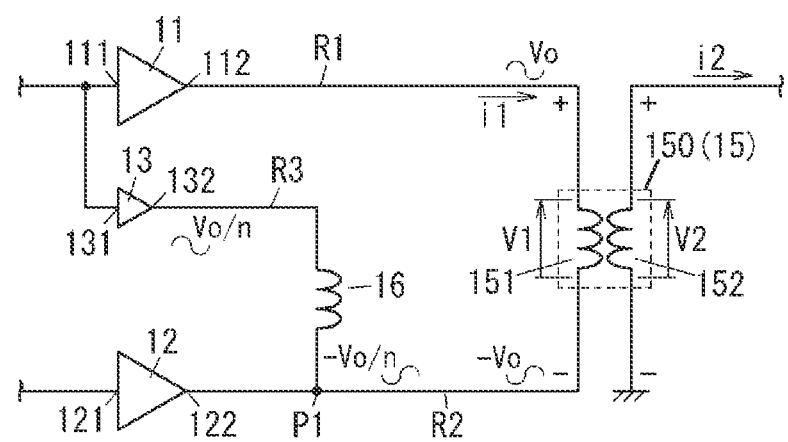
FIG. 5A is a circuit diagram of the power amplifying circuit according to the embodiment in a first operation period.

FIG. 5A is a circuit diagram of the power amplifying circuit 1 in a first operation period (saturation operation period). In the first operation, all of the first amplifier 11, the second amplifier 12, and the third amplifier 13 are in operation. Here, as described above, the third amplifier 13 is made up of the single second unit cell 130 and has a smaller output power compared with the first amplifier 11 and the second amplifier 12. Accordingly, the output power of the third amplifier 13 in the first operation period is a sufficiently small value compared with the output power of the first amplifier 11 and the output power of the second amplifier 12, and has no influence on the output power of the power amplifying circuit 1 as a whole. At this time, a power level of the second signal input to the second amplifier 12 is greater than or equal to a reference power level. For example, in the case where the output power of the first amplifier 11 is equal to the output power of the second amplifier 12, the "reference power level" is specified by a power that is substantially twice the input power to the first amplifier 11. Further, for example, in the case where the input power to the first amplifier 11 and the input power to the second amplifier 12 are gradually increased, the "reference power level" is specified by a power at which the first amplifier 11 is saturated but the second amplifier 12 does not start outputting.

Here, assume that the impedance of the first amplifier 11 is $Z_1$, the impedance of the second amplifier 12 is $Z_2$, and the impedance of the third amplifier 13 is $Z_3$. Further, assume that the output voltage of each of the first amplifier 11 and the second amplifier 12 is $V_0$, the voltage between two ends of the primary winding 151 (hereinafter, referred to as "primary side voltage") is $V_1$, and the voltage between two ends of the secondary winding 152 (hereinafter, referred to as "secondary side voltage") is $V_2$. Further, assume that the current flowing through the primary winding 151 (hereinafter, referred to as "primary side current") is $i_1$, and the current flowing through the secondary winding 152 (hereinafter, referred to as "secondary side current") is $i_2$. Further, as described above, the ratio of numbers of turns of the primary winding 151 and the secondary winding 152 is 1:m.

Here, as described above, the first amplified signal (voltage signal) output from the first amplifier 11 has the inverted phase relative to the phase of the second amplified signal (voltage signal) output from the second amplifier 12, and thus the primary side voltage $V_1$ applied to the primary winding 151 is expressed by Equation (1).

[Math. 1]

$$V_1 = 2 \times V_0 \tag{1}$$

Accordingly, the secondary side voltage $V_2$ applied to the secondary winding 152 is expressed by Equation (2).

[Math. 2]

$$V_2 = m \times V_1 = 2 \times m \times V_0 \tag{2}$$

Further, the secondary side current $i_2$ flowing through the secondary winding 152 is expressed by Equation (3)

[Math. 3]

$$i_2 = \frac{1}{m} \times i_1 \tag{3}$$

Here, when the resistance value of the secondary winding 152 is defined as $R_L$, the resistance value $R_L$ is expressed by Equation (4).

[Math. 4]

$$R_L = \frac{V_2}{i_2} = \frac{2 \times m \times V_0}{\frac{1}{m} \times i_1} = \frac{2 \times m^2 \times V_0}{i_1} \quad (4)$$

Accordingly, in the first operation period, each of the impedance $Z_1$ of the first amplifier 11 and the impedance $Z_2$ of the second amplifier 12 is expressed by Equation (5).

[Math. 5]

$$Z_1 = Z_2 = \frac{V_0}{i_1} = V_0 \times \frac{R_L}{2 \times m^2 \times V_0} = \frac{R_L}{2 \times m^2} \quad (5)$$

In the first operation period, each of the impedance $Z_1$ of the first amplifier 11 and the impedance $Z_2$ of the second amplifier 12 is low and is, for example, 5Ω to 10Ω. Further, as described above, the output power of the third amplifier 13 is sufficiently small compared with the output power of the first amplifier 11 and the output power of the second amplifier 12, and has no influence on the output power of the power amplifying circuit 1 as a whole. Accordingly, the amplification efficiency of the third amplifier 13 may be lower compared with the amplification efficiencies of the first amplifier 11 and the second amplifier 12.

(4.2) Second Operation

Figure 5B:
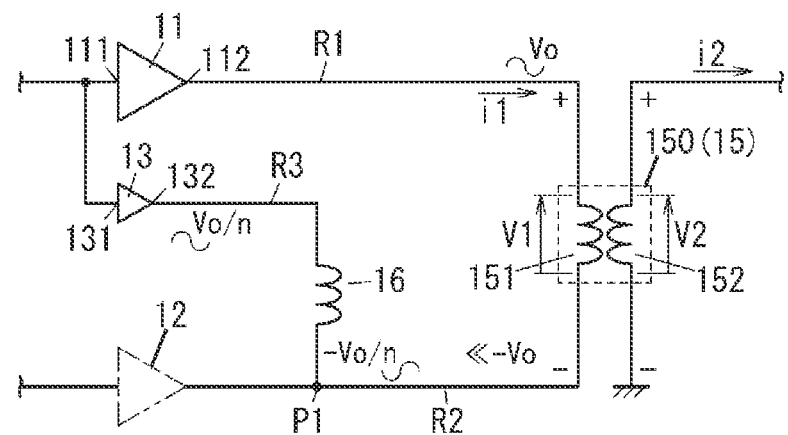
FIG. 5B is a circuit diagram of the power amplifying circuit according to the embodiment in a second operation period.

FIG. 5B is a circuit diagram of the power amplifying circuit 1 in a second operation period. In the second operation, the input power to the second amplifier 12 becomes smaller, and when the output voltage of the second amplifier 12 approaches 0 V, the impedance $Z_2$ of the second amplifier 12 increases considerably. As a result, the second end portion of the primary winding 151 of the transformer 150 becomes open (∞). On the other hand, because the first amplifier 11 and the third amplifier 13 are in operation, the second end portion of the primary winding 151 of the transformer 150 becomes short-circuited because of contribution of the impedance $Z_3$ of the third amplifier 13. At this time, the impedance $Z_2$ of the second amplifier 12 becomes always large, and thus the second amplifier 12 is in the state where the second amplifier 12 is cut off from the second signal path R2.

At this time, the third amplified signal output from the third amplifier 13 is a sufficiently small value compared with the first amplified signal output from the first amplifier 11, and thus the primary side voltage $V_1$ applied to the primary winding 151 is expressed by Equation (6).

[Math. 6]

$$V_1 = V_0 \quad (6)$$

Accordingly, the secondary side voltage $V_2$ applied to the secondary winding 152 is expressed by Equation (7).

[Math. 7]

$$V_2 = m \times V_1 = m \times V_0 \quad (7)$$

The secondary side current $i_2$ is the same as in the first operation period, and thus the resistance value $R_L$ of the secondary winding 152 is expressed by Equation (8).

[Math. 8]

$$R_L = \frac{V_2}{i_2} = \frac{m \times V_0}{\frac{1}{m} \times i_1} = \frac{m^2 \times V_0}{i_1} \quad (8)$$

Accordingly, in the second operation period, the impedance $Z_1$ of the first amplifier 11 is expressed by Equation (9).

[Math. 9]

$$Z_1 = \frac{V_0}{i_1} = V_0 \times \frac{R_L}{m^2 \times V_0} = \frac{R_L}{m^2} \quad (9)$$

In summary, from Equation (5) and Equation (9), the impedance $Z_1$ of the first amplifier 11 in the second operation period becomes twice the impedance $Z_1$ of the first amplifier 11 in the first operation period. Accordingly, in the second operation period, compared with the first operation period, it becomes possible to improve the amplification efficiency of the power amplifying circuit 1. That is to say, according to the power amplifying circuit 1 of the present embodiment, it becomes possible to suppress the decrease of the amplification efficiency.

(5) CHARACTERISTICS OF POWER AMPLIFYING CIRCUIT

Next, characteristics of the power amplifying circuit 1 according to the present embodiment is described with reference to FIG. 6.

Figure 6:
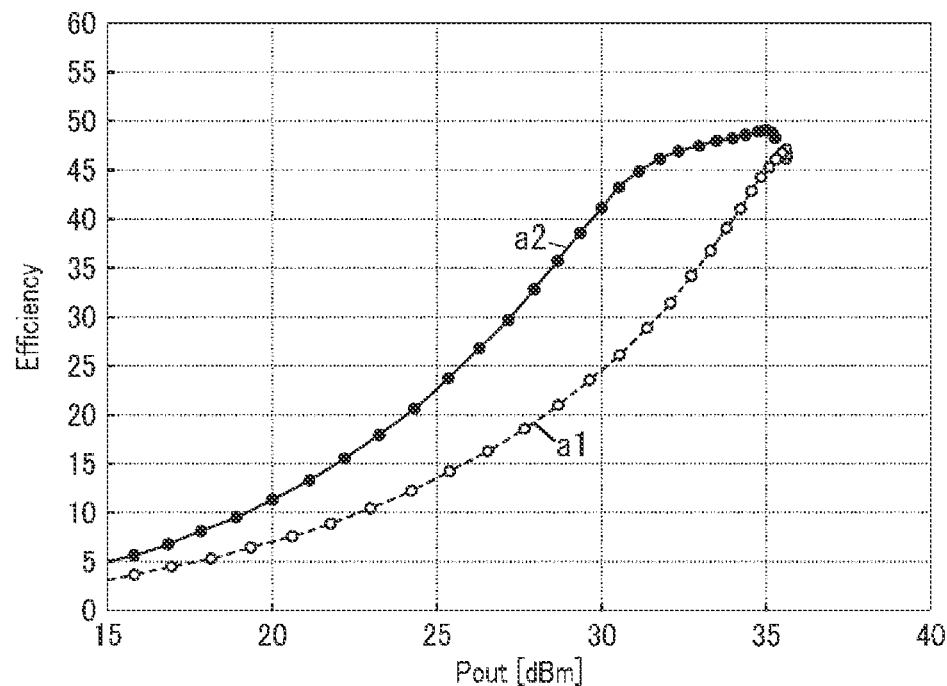
FIG. 6 is a characteristic diagram illustrating a relationship between output power and amplification efficiency with regard to the power amplifying circuit according to the embodiment.

The horizontal axis of FIG. 6 represents the output power of the power amplifying circuit 1, and the vertical axis of FIG. 6 represents the amplification efficiency of the power amplifying circuit 1. Further, the dashed line a1 of FIG. 6 represents the characteristic of a power amplifying circuit 1 according to a comparative example, and the solid line a2 of FIG. 6 represents the characteristic of the power amplifying circuit 1 according to the present embodiment.

As described above, in the power amplifying circuit 1 according to the present embodiment, each of the first amplifier 11 and the third amplifier 13 is a Class AB amplifier, and the second amplifier 12 is a Class C amplifier. In contrast, in the power amplifying circuit 1 according to the comparative example, each of the first amplifier 11, the second amplifier 12, and the third amplifier 13 is a Class AB amplifier.

According to FIG. 6, in the range of the output power of the power amplifying circuit 1 greater than or equal to 15 dBm and less than or equal to 36 dBm, the amplification efficiency of the power amplifying circuit 1 according to the present embodiment exceeds the amplification efficiency of the power amplifying circuit 1 according to the comparative example. That is to say, the power amplifying circuit 1 according to the present embodiment enables the improvement of the amplification efficiency compared with the power amplifying circuit 1 according to the comparative example.

Here, in a first range of the output power of the power amplifying circuit 1 greater than or equal to 17 dBm and less than or equal to 31 dBm, the first amplifier 11 and the third amplifier 13 are in operation, and the operation of the second amplifier 12 is stopped. That is to say, in the first range, the power amplifying circuit 1 performs the second operation. Further, in a second range of the output power of the power amplifying circuit 1 greater than or equal to 31 dBm and less than or equal to 36 dBm, all of the first amplifier 11, the second amplifier 12, and the third amplifier 13 are in operation. That is to say, in the second range, the power amplifying circuit 1 performs the first operation. As described above, in the first range, the impedance $Z_1$ of the first amplifier 11 is doubled, and thus the amount of change of the amplification efficiency is greater compared with that in the second range.

(6) EFFECTS

The power amplifying circuit 1 according to the present embodiment includes the splitter 14, the first amplifier 11, the second amplifier 12, and the third amplifier 13. The splitter 14 splits an input signal into a first signal and a second signal. The first amplifier 11 has the first input terminal 111 and the first output terminal 112, amplifies the first signal, and outputs the first amplified signal. The second amplifier 12 has the second input terminal 121 and the second output terminal 122, amplifies the second signal, and outputs the second amplified signal. The third amplifier 13 has the third input terminal 131 and the third output terminal 132 and outputs the third amplified signal obtained by amplifying the first signal. The first output terminal 112 and the second output terminal 122 are connected to each other. The third input terminal 131 is connected to the first input terminal 111. The third output terminal 132 is connected to the second output terminal 122.

As described above, in the power amplifying circuit 1 according to the present embodiment, the third output terminal 132 of the third amplifier 13 is connected to the second output terminal 122 of the second amplifier 12. Accordingly, even when the second amplifier 12 is not in operation (that is, in the second operation period), because of the contribution of the impedance $Z_3$ of the third amplifier 13, it becomes possible to make the path on the second amplifier 12 side appear to be on a short-circuited side. That is to say, the power amplifying circuit 1 according to the present embodiment enables the realization of a Doherty amplifying circuit in which the impedance on the second amplifier 12 side is adjustable without necessarily using a λ/4 line. Further, space for installing the λ/4 line becomes optional, and size reduction of the power amplifying circuit 1 can be achieved by that amount of space. Here, "λ" is the wavelength of each of the radio frequency signals output from the first amplifier 11 and the second amplifier 12.

(7) MODIFIED EXAMPLES

(7.1) Modified Example 1

A power amplifying circuit 1A according to a modified example 1 is described with reference to FIG. 7. With regard to the power amplifying circuit 1A according to the modified example 1, constituent elements similar to those of the power amplifying circuit 1 according to the aforementioned embodiment are denoted by the same reference characters, and descriptions thereof are omitted.

The power amplifying circuit 1A according to the modified example 1 is different from the power amplifying circuit 1 according to the aforementioned embodiment in that a capacitor 17 is provided in the third signal path R3.

Figure 7:
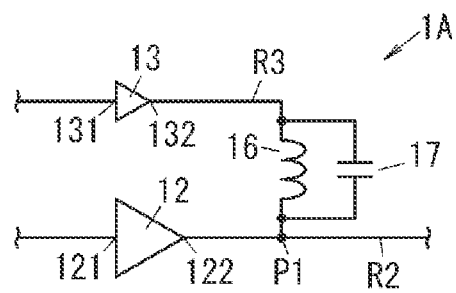
FIG. 7 is a circuit diagram of relevant part of a power amplifying circuit according to a modified example 1 of the embodiment.

As illustrated in FIG. 7, the capacitor 17 is provided in the third signal path R3 from the third output terminal 132 of the third amplifier 13. More specifically, in the power amplifying circuit 1A according to the modified example 1, the inductor 16 is connected in series to the third signal path R3, and moreover, the capacitor 17 is connected in parallel with respect to the inductor 16.

Compared with the case where only the inductor 16 is connected to the third signal path R3, the power amplifying circuit 1A according to the modified example 1 has an effect of facilitating the impedance adjustment of the third amplifier 13.

(7.2) Modified Example 2

A power amplifying circuit 1B according to a modified example 2 is described with reference to FIG. 8. With regard to the power amplifying circuit 1B according to the modified example 2, constituent elements similar to those of the power amplifying circuit 1 according to the aforementioned embodiment are denoted by the same reference characters, and descriptions thereof are omitted. Further, in FIG. 8, a subsequent circuit following the first output terminal 112 of the first amplifier 11, a subsequent circuit following the second output terminal 122 of the second amplifier 12, and a subsequent circuit following the third output terminal 132 of the third amplifier 13 are similar to those in FIG. 1, and illustration thereof is omitted.

The power amplifying circuit 1B according to the modified example 2 is different from the power amplifying circuit 1 according to the aforementioned embodiment in that a splitter 14B includes a transformer 140.

Figure 8:
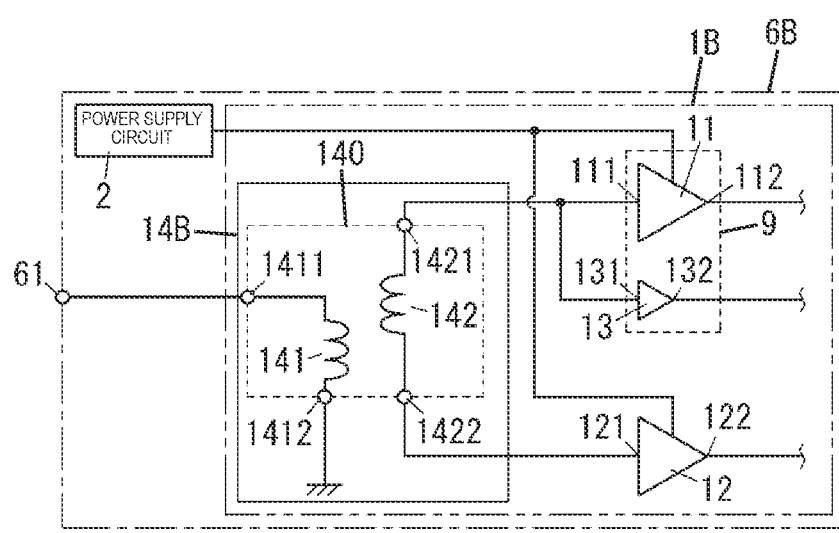
FIG. 8 is a circuit diagram illustrating an example of a splitter included in a power amplifying circuit according to a modified example 2 of the embodiment.

As illustrated in FIG. 8, the splitter 14B includes the transformer 140. The transformer 140 includes a primary winding 141 and a secondary winding 142. A first end portion 1411 of the primary winding 141 is connected to the signal input terminal 61. A second end portion 1412 of the primary winding 141 is connected to ground. That is to say, the primary winding 141 of the transformer 140 is connected between the ground and the signal input terminal 61 to which an input signal is input. A first end portion 1421 of the secondary winding 142 is connected to the first input terminal 111 of the first amplifier 11 and to the third input terminal 131 of the third amplifier 13. A second end portion 1422 of the secondary winding 142 is connected to the second input terminal 121 of the second amplifier 12. The ratio of numbers of turns of the primary winding 141 and the secondary winding 142 is, for example, 1:1.

In the power amplifying circuit 1B according to the modified example 2, regarding an input signal input from the signal processing circuit 4 (see FIG. 2) via the signal input terminal 61, a first signal split by the splitter 14B is input to the first amplifier 11 and the third amplifier 13, and a second signal split by the splitter 14B is input to the second amplifier 12.

(7.3) Other Modified Examples

The aforementioned embodiment is one of various embodiments of the present disclosure. The aforementioned embodiment can be modified in various ways according to the design or the like.

In the aforementioned embodiment, the third amplifier 13 is a part of the first amplifier 11, and the first amplifier 11 and the third amplifier 13 make up one chip. However, the first amplifier 11 and the third amplifier 13 do not necessarily make up one chip. For example, the first amplifier 11 and the third amplifier 13 may be different amplifiers, or the first amplifier 11 and the third amplifier 13 may make up of different chips.

In the aforementioned embodiment, the area S1 of the first unit cell 110 that makes up part of the first amplifier 11 is equal to the area S2 of the second unit cell 130 that makes up the third amplifier 13. However, for example, the area S1 of the first unit cell 110 may be different from the area S2 of the second unit cell 130. More specifically, the area S1 of the first unit cell 110 may be larger than the area S2 of the second unit cell 130, or the area S2 of the second unit cell 130 may be larger than the area S1 of the first unit cell 110.

In the aforementioned embodiment, the first amplified signal output from the first amplifier 11 has an inverted phase relative to the phase of the second amplified signal output from the second amplifier 12. However, the first amplified signal output from the first amplifier 11 does not necessarily have an inverted phase relative to the phase of the second amplified signal output from the second amplifier 12. It is sufficient that both the phases are different from each other. Further, the first amplified signal output from the first amplifier 11 has an inverted phase relative to the phase of the third amplified signal output from the third amplifier 13. However, the first amplified signal output from the first amplifier 11 does not necessarily have an inverted phase relative to the phase of the third amplified signal output from the third amplifier 13. It is sufficient that both the phases are different from each other.

In the aforementioned embodiment, one of the plurality of the first unit cells 110 that make up the first amplifier 11 is used as the second unit cell 130 of the third amplifier 13. This first unit cell 110 may also be used as a unit cell for monitoring the impedance $Z_1$ of the first amplifier 11. For example, as in the aforementioned embodiment, in the case where the number of the first unit cells 110 that make up the first amplifier 11 is 100, by multiplying the impedance obtained from one of the first unit cells 110 by 100, it becomes possible to obtain the impedance $Z_1$ of the first amplifier 11.

In the aforementioned embodiment, the first amplifier 11 and the third amplifier 13 are different in the number of the first unit cells 110 included therein. However, for example, the first amplifier 11 and the third amplifier 13 may be different in the output power. In that case, so long as the output power of the first amplifier 11 is greater than the output power of the third amplifier 13, the numbers of the first unit cells 110 included in the first amplifier 11 and the third amplifier 13 may be the same or may be different.

Further, in the aforementioned embodiment, the first amplifier 11 and the third amplifier 13 are different in the number of the first unit cells 110 included therein. However, for example, the first amplifier 11 and the third amplifier 13 may be different in the emitter area. In that case, so long as the emitter area of the first amplifier 11 is greater than the emitter area of the third amplifier 13, the numbers of the first unit cells 110 included in the first amplifier 11 and the third amplifier 13 may be the same or may be different.

In the aforementioned embodiment, the number of the first unit cells 110 that make up the first amplifier 11 is 100. However, the number of the first unit cells 110 is not limited to 100. The number of the first unit cells 110 that make up the first amplifier 11 may be, for example, 50 to 100. Further, in the aforementioned embodiment, the number of the second unit cells 130 (first unit cells 110) that make up the third amplifier 13 is one. However, the number of the second unit cells 130 is not limited to one. For example, the third amplifier 13 may be made up of two first unit cells 110.

(Aspects)

In the present specification, the following aspects are disclosed.

A power amplifying circuit (1; 1A; 1B) according to a first aspect includes a splitter (14; 14B), a first amplifier (11), a second amplifier (12), and a third amplifier (13). The splitter (14; 14B) splits an input signal into a first signal and a second signal. The first amplifier (11) has a first input terminal (111) and a first output terminal (112), amplifies the first signal, and outputs a first amplified signal. The second amplifier (12) has a second input terminal (121) and a second output terminal (122), amplifies the second signal, and outputs a second amplified signal. The third amplifier (13) has a third input terminal (131) and a third output terminal (132), amplifies the first signal, and outputs a third amplified signal. The first output terminal (112) and the second output terminal (122) are connected to one another. The third input terminal (131) is connected to the first input terminal (111). The third output terminal (132) is connected to the second output terminal (122).

This aspect enables size reduction of the power amplifying circuit (1; 1A; 1B).

In a power amplifying circuit (1; 1A; 1B) according to a second aspect, the second amplifier (12) outputs the second amplified signal when a power level of the second signal is greater than or equal to a reference power level, in the first aspect.

This aspect enables the realization of a Doherty amplifying circuit without necessarily using a $\lambda/4$ line.

In a power amplifying circuit (1; 1A; 1B) according to a third aspect, when the second amplifier (12) is not in operation, a phase of the third amplified signal at the third output terminal (132) is different from a phase of the third amplified signal at a connection point (P1) of a signal path (R2) from the second output terminal (122) and a signal path (R3) from the third output terminal (132), in the first or second aspect.

This aspect enables the realization of a Doherty amplifying circuit without necessarily using a $\lambda/4$ line.

In a power amplifying circuit (1; 1A; 1B) according to a fourth aspect, the first amplified signal at the first output terminal (112) has an inverted phase relative to the phase of the third amplified signal at the connection point (P1), in the third aspect.

According to this aspect, it becomes possible to cancel out even number waves of an output signal output from the power amplifying circuit (1; 1A; 1B) and amplify the output signal to double the amplitude of the output signal.

The power amplifying circuit (1; 1A; 1B) according to a fifth aspect further includes an inductor (16), in any one of the first to fourth aspects. The inductor (16) is provided in a signal path (R3) from the third output terminal (132) to a connection point (P1) of the third output terminal (132) and the second output terminal (122).

This aspect enables the adjustment of the impedance of the third amplifier (13).

The power amplifying circuit (1A) according to a sixth aspect further includes a capacitor (17), in the fifth aspect. The capacitor (17) is provided in the signal path (R2) from the third output terminal (132) to the connection point (P1).

This aspect enables the adjustment of the impedance of the third amplifier (13).

The power amplifying circuit (1; 1A; 1B) according to a seventh aspect further includes a combining circuit (15), in any one of the first to sixth aspects. The combining circuit (15) includes a transformer (150) and combines the first amplified signal, the second amplified signal, and the third amplified signal.

According to this aspect, it becomes possible to combine the first amplified signal, the second amplified signal, and the third amplified signal.

In the power amplifying circuit (1; 1A; 1B) according to an eighth aspect, the first amplifier (11) includes a plurality of first unit cells (110) that amplify the first signal, in any one of the first to seventh aspects. The third amplifier (13) includes at least one second unit cell (130) that amplifies the first signal. An area (S1) of each of the plurality of first unit cells (110) of the first amplifier (11) is equal to an area (S2) of the second unit cell (130) of the third amplifier (13).

In the power amplifying circuit (1; 1B) according to a ninth aspect, a number of the plurality of first unit cells (110) of the first amplifier (11) is greater than a number of the at least one second unit cell (130) of the third amplifier (13), in the eighth aspect.

According to this aspect, it becomes possible to reduce the influence of the third amplified signal on the first amplified signal.

The power amplifying circuit (1; 1A; 1B) according to a tenth aspect further includes a mounting board (8), in any one of the first to ninth aspects. The mounting board (8) has a first principal surface (81) and a second principal surface (82), the first principal surface and the second principal surface facing one another. The splitter (14; 14B), the first amplifier (11), the second amplifier (12), and the third amplifier (13) are mounted in or on the mounting board (8). In plan view in a thickness direction (D1) of the mounting board (8), a first signal path (R1) through which the first amplified signal travels and a second signal path (R2) through which the second amplified signal travels are symmetric in shape.

This aspect facilitates the impedance matching between the first amplifier (11) and the second amplifier (12).

In the power amplifying circuit (1; 1A; 1B) according to an eleventh aspect, in plan view in the thickness direction (D1), a wire width (W1) of the first signal path (R1) is wider than a wire width (W3) of a third signal path (R3) through which the third amplified signal travels, in the tenth aspect.

In the power amplifying circuit (1; 1A; 1B) according to a twelfth aspect, in plan view in the thickness direction (D1), a wire width (W2) of the second signal path (R2) is wider than a wire width (W3) of a third signal path (R3) through which the third amplified signal travels, in the tenth or eleventh aspect.

In the power amplifying circuit (1B) according to a thirteenth aspect, the splitter (14B) includes a transformer (140), in any one of the first to twelfth aspects. The transformer (140) includes a primary winding (141) and a secondary winding (142), the primary winding and the secondary winding magnetically coupling one another. A first end portion (1411) of the primary winding (141) is connected to a signal input terminal (61) to which the input signal is input. A second end portion (1412) of the primary winding (141) is connected to ground. A first end portion (1421) of the secondary winding (142) is connected to the first input terminal (111) of the first amplifier (11) and the third input terminal (131) of the third amplifier (13). A second end portion (1422) of the secondary winding (142) is connected to the second input terminal (121) of the second amplifier (12).

This aspect enables the splitter (14; 14B) to split the input signal input via the signal input terminal (61) into the first signal and the second signal.

A radio frequency circuit (6) according to a fourteenth aspect includes the power amplifying circuit (1; 1A; 1B) according to any one of the first to thirteenth aspects and a filter (3). The filter (3) allows a radio frequency signal to pass through, the radio frequency signal being amplified in power by the power amplifying circuit (1; 1A; 1B) and output from the power amplifying circuit (1; 1A; 1B).

This aspect enables size reduction of the power amplifying circuit (1; 1A; 1B).

A communication device (7) according to a fifteenth aspect includes the radio frequency circuit (6) according to the fourteenth aspect and a signal processing circuit (4). The signal processing circuit (4) is connected to the radio frequency circuit (6).

This aspect enables size reduction of the power amplifying circuit (1; 1A; 1B).

REFERENCE SIGNS LIST 1, 1A, 1B Power amplifying circuit
2 Power supply circuit
3 Filter
4 Signal processing circuit
5 Antenna
6 Radio frequency circuit
7 Communication device
8 Mounting board
11 First amplifier
12 Second amplifier
13 Third amplifier
14, 14B Splitter
15 Combining circuit
16 Inductor
17 Capacitor
41 RF signal processing circuit
42 Base band signal processing circuit
61 Signal input terminal
62 Antenna terminal
81 First principal surface
82 Second principal surface
110, 130 Unit cell
111 First input terminal
112 First output terminal
121 Second input terminal
122 Second output terminal
131 Third input terminal
132 Third output terminal
140 Transformer
141 Primary winding
142 Secondary winding
150 Transformer
151 Primary winding
152 Secondary winding
1411, 1421 First end portion
1412, 1422 Second end portion
D1 Thickness direction
$i_1$ Primary side current
$i_2$ Secondary side current
R1 First signal path
R2 Second signal path
R3 Third signal path
S1, S2 Area
$V_0$ Output voltage
$V_1$ Primary side voltage
$V_2$ Secondary side voltage
W1 Wire width (of first signal path)
W2 Wire width (of second signal path)
W3 Wire width (of third signal path)

The invention claimed is:

1. A power amplifying circuit comprising:
   a splitter that is configured to split an input signal into a first signal and a second signal;
   a first amplifier that comprises a first input terminal and a first output terminal, is configured to amplify the first signal, and is configured to output a first amplified signal;
   a second amplifier that comprises a second input terminal and a second output terminal, is configured to amplify the second signal, and configured to output a second amplified signal; and
   a third amplifier that comprises a third input terminal and a third output terminal, is configured to amplify the first signal, and is configured to output a third amplified signal, wherein
   the first output terminal is connected to the second output terminal,
   the third input terminal is connected to the first input terminal,
   the third output terminal is connected to the second output terminal, and
   when the second amplifier is not in operation, a phase of the third amplified signal at the third output terminal is different from a phase of the third amplified signal at a connection point of a signal path from the second output terminal and a signal path from the third output terminal.

2. The power amplifying circuit according to claim 1, wherein
   the second amplifier is configured to output the second amplified signal when a power level of the second signal is greater than or equal to a reference power level.

3. The power amplifying circuit according to claim 1, wherein
   the first amplified signal at the first output terminal comprises an inverted phase relative to the phase of the third amplified signal at the connection point.

4. The power amplifying circuit according to claim 1, further comprising:
   a capacitor in the signal path from the third output terminal to the connection point.

5. The power amplifying circuit according to claim 1, further comprising:
   a combining circuit that comprises a transformer and is configured to combine the first amplified signal, the second amplified signal, and the third amplified signal.

6. The power amplifying circuit according to claim 1, wherein
   the first amplifier comprises a plurality of first unit cell amplifiers that are configured to amplify the first signal,
   the third amplifier comprises at least one second unit cell amplifier that is configured to amplify the first signal, and
   an area of each of the plurality of first unit cell amplifiers of the first amplifier is equal to an area of the second unit cell amplifier of the third amplifier.

7. The power amplifying circuit according to claim 6, wherein
   a number of the plurality of first unit cell amplifiers of the first amplifier is greater than a number of the at least one second unit cell amplifier of the third amplifier.

8. The power amplifying circuit according to claim 1, further comprising:
   a mounting board that comprises a first principal surface and a second principal surface, the first principal surface and the second principal surface facing each other, wherein
   the splitter, the first amplifier, the second amplifier, and the third amplifier are mounted in or on the mounting board, and
   in plan view in a thickness direction of the mounting board, a first signal path through which the first amplified signal travels and a second signal path through which the second amplified signal travels are symmetric in shape.

9. The power amplifying circuit according to claim 8, wherein
   in plan view in the thickness direction, a wire width of the first signal path is wider than a wire width of a third signal path through which the third amplified signal travels.

10. The power amplifying circuit according to claim 8, wherein
    in plan view in the thickness direction, a wire width of the second signal path is wider than a wire width of a third signal path through which the third amplified signal travels.

11. The power amplifying circuit according to claim 1, wherein
    the splitter comprises a transformer that comprises a primary winding and a secondary winding, the primary winding and the secondary winding magnetically coupling each other,
    a first end portion of the primary winding is connected to a signal input terminal to which the input signal is input,
    a second end portion of the primary winding is connected to ground,
    a first end portion of the secondary winding is connected to the first input terminal of the first amplifier and the third input terminal of the third amplifier, and
    a second end portion of the secondary winding is connected to the second input terminal of the second amplifier.

12. A radio frequency circuit comprising:
    the power amplifying circuit according to claim 1; and
    a filter that is configured to allow a radio frequency signal to pass through, wherein the power amplifying circuit is configured to amplify and output the radio frequency signal.

13. A communication device comprising:
    the radio frequency circuit according to claim 12; and
    a signal processing circuit connected to the radio frequency circuit.

14. The power amplifying circuit according to claim 2, wherein
    the first amplified signal at the first output terminal comprises an inverted phase relative to the phase of the third amplified signal at the connection point.

15. The power amplifying circuit according to claim 2, further comprising:
    an inductor in a signal path from the third output terminal to a connection point of the third output terminal and the second output terminal.

16. The power amplifying circuit according to claim 1, further comprising:
    an inductor in the signal path from the third output terminal to the connection point of the third output terminal and the second output terminal.

17. The power amplifying circuit according to claim 3, further comprising:
 an inductor in the signal path from the third output terminal to the connection point of the third output terminal and the second output terminal.

\* \* \* \* \*